(12) United States Patent
DiCarlo et al.

(10) Patent No.: US 7,262,900 B2
(45) Date of Patent: Aug. 28, 2007

(54) UTILIZING A PROTECTIVE PLUG TO MAINTAIN THE INTEGRITY OF THE FTP SHRINK HINGE

(75) Inventors: Anthony DiCarlo, Richardson, TX (US); Rabah Mezenner, Richardson, TX (US); James C. Baker, Coppell, TX (US); Mark A. Franklin, Plano, TX (US); George Harakas, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 183 days.

(21) Appl. No.: 11/125,473

(22) Filed: May 10, 2005

(65) Prior Publication Data
US 2006/0255424 A1 Nov. 16, 2006

(51) Int. Cl.
*G02B 26/00* (2006.01)
(52) U.S. Cl. .................. 359/291; 359/290; 359/295
(58) Field of Classification Search ............... 359/224, 359/223, 291, 290, 295
See application file for complete search history.

(56) References Cited

U.S. PATENT DOCUMENTS

| 5,506,171 | A | 4/1996 | Leonard et al. |
| 5,510,824 | A | 4/1996 | Nelson |
| 5,535,047 | A | 7/1996 | Hornbeck |
| 5,592,188 | A | 1/1997 | Doherty et al. |
| 5,703,728 | A | 12/1997 | Smith et al. |
| 5,943,157 | A | 8/1999 | Florence et al. |
| 6,740,592 | B1 * | 5/2004 | Doong ............. 438/700 |
| 2002/0042202 | A1 * | 4/2002 | Fujimoto ......... 438/700 |
| 2006/0046422 | A1 * | 3/2006 | Tran et al. ....... 438/401 |

* cited by examiner

*Primary Examiner*—Timothy Thompson
(74) *Attorney, Agent, or Firm*—Charles A. Brill; Wade James Brady, III; Frederick J. Telecky, Jr.

(57) ABSTRACT

As robust hinge post structure for use with torsional hinged devices such as micromirrors and method of manufacturing is disclosed. The fabrication process uses a protective layer such as BARC on the bottom of the aperture used to form the hinge post structure to protect an oxide layer during an etching step. The oxide layer, in turn protects the metal layer at the bottom of the aperture. Therefore, the metal layer, the oxide layer, and the protective layer prevent the erosion and/or pitting of the bottom electrode during a cleaning process, and provide additional support to the structure.

24 Claims, 3 Drawing Sheets

UTILIZING A PROTECTIVE PLUG TO MAINTAIN THE INTEGRITY OF THE FTP SHRINK HINGE

TECHNICAL FIELD

The present invention relates to the fabrication of micromachined devices having second level structures supported above a first level or substrate level by "post" structures. More specifically, the invention relates to the fabrication of torsional hinge support posts such as used by torsional hinge DMD (Digital Micro-mirror Devices).

BACKGROUND

Texas Instruments Incorporated of Dallas, Tex. has developed semiconductor chips containing an array of individually controllable mirrors (substantially square and/or diamond shaped) having a reflective surface. More specifically, the DMD is revolutionary in that it is truly a digital display device in an integrated circuit solution. The DMD is an electro/mechanical/optical SLM (Spacial Light Modulator) now being used to provide images for projectors and hard copy printers. The DMD is a monolithic single-chip integrated circuit SLM comprised of a high density array of square or diamond shaped moveable micromirrors. The micromirrors have an X and Y surface dimension of between about 9 micrometers and 17 micrometers. These mirrors are fabricated over address circuitry including an array of RAM cells and address electrodes. Each mirror forms one pixel of the DMD array and is bi-stable. That is, stable in one of two positions wherein a source of light directed upon the mirror array will be reflected in one of two directions. In the stable or "on" mirror position, incident light to the mirror will be reflected to a projector lens and focused on a display screen or a photo-sensitive element of a printer. In the other or "off" mirror position, light directed on the mirror will be deflected to a light absorber. Further, each mirror of the array is individually controlled to either direct incident light into the projector lens, or to the light absorber. The projector lens ultimately focuses and magnifies the modulated light from the pixel mirrors onto photoresistive medium or a display screen and produces an image. If each pixel mirror of the DMD array is in the "on" position, the displayed image will be an array of bright pixels. As is discussed below, each of the mirrors is supported by a pair of torsional hinges. However, it should be understood that although the invention is discussed with respect to mirrors, the invention could also be used with other microdevices requiring an array of structures supported by torsional hinges.

As detailed and commonly assigned in U.S. Pat. No. 5,535,047 entitled "Active Yoke Hidden Hinge Digital Micromirror Device" to Hornback, and shown in FIG. 1 of the present application, there is disclosed a digital micromirror device (DMD) spatial light modulator shown at 10. DMD 10 is a single chip integrated circuit that includes an array of micromirrors 20 monolithically fabricated over a memory cell array formed upon a substrate. As shown, each pixel mirror 20 includes a square or diamond shaped mirror supported upon and elevated above a butterfly shaped yoke generally shown at 22 by a rectangular support post 24. Support post 24 extends downward from the center of the mirror 20 and is attached to the center area 26 of the yoke 22 along the torsional axes 28 (indicated by dashed lines), as shown, to balance the center of mass of mirror 20 on yoke 22. Yoke 22 is actually supported at the center area 26 along torsional axes 28 by a pair of torsional hinges 30. The other end of each torsional hinge 30 is attached to and supported by a hinge support post cap 32 defined on top of a respective hinge support post 34. A pair of elevated mirror address electrodes 36 and 38 are supported by a respective address support post 40. The address support posts 40 support the address electrodes 36 and 38 away from and above a biased/reset bus, at a pair of substrate level address electrode pads 42. In a similar manner, the hinge support posts 34 support the torsional hinges 34, which in turn support the yoke 22. To selectively reflect light, mirror 20 and yoke 22 are together rotated about the torsional axes 28 of the yoke 22, defined by the hinges 30.

As the size of the individual pixels have shrunk below 16 micrometers, the electrode support post 40 and the support post 34 used to raise the reflective structure above electrode pads 36 and 38 on the substrate level, have developed integrity issues. More specifically, the hinge support post 34, which support the torsional hinges 30 and the electrode support post 40, are subject to corrosive structure damage during the fabrication processes.

Referring now to FIG. 2, there is a cross-section illustration showing the structure damage suffered during such fabrication. As shown, substrate 50 includes an electrode layer 52 which will be patterned and etched to define individual electrode pads, such as for example electrode pads 44 and 46 discussed above with respect to FIG. 1. A sacrificial spacer layer 54 is deposited over the electrode layer 52. The spacer layer 54 is then patterned and etched through to the electrical layer 52 to form hinge post apertures, such as hinge post aperture 56. A metal layer 58 is deposited over the top surface 60 of the spacer layer 54 in the sidewalls of the aperture 56. The metal layer 58 when originally deposited also covered the top or exposed surface of the electrode layer 52 (not shown), which is at the bottom of the aperture 56. However, the metal layer on the bottom of the aperture is subsequently removed during an etching process. The metal layer 58 on the sidewalls 62 of the hinge post aperture is also covered with an oxide layer 64, which provides additional support. The oxide layer 64 is originally deposited over the bottom 66 of aperture 56 and the top surfaces of the metal layer 58 as well as the sidewalls of aperture 56. However, as discussed below, the oxide is removed everywhere except the sidewalls of the aperture by etching.

More specifically, the process of patterning and etching the metal layer 58 includes the deposit of between about 2,000 Å and 5,000 Å layer of oxide over the metal layer including the metal covering the hinge post aperture 56. The oxide layer 64 is anisotropically etched, which, as will be appreciated by those skilled in the art, leaves the oxide layer 64 on vertical surfaces such as the sidewalls of the hinge post aperture. The oxide layer on the sidewalls array provides additional support to the hinge post.

Although not a significant problem with the 16 micrometer mirrors, the size reduction of the newer and smaller mirrors means that because of the very small dimensions of the aperture entrance at the top surface of the aperture, only a very thin layer of the protective oxide layer is deposited on the bottom 66 of the hinge post aperture and may be completely removed during the anisotropic etch. Likewise, as can be seen in the illustration of FIG. 2, the oxide layer thickness on the sidewalls is significantly decreased at the bottom of the aperture. In addition, the very thin layer of oxide often includes pores or holes that may extend completely through the thin layer. Consequently, during the patterning of the metal layer, the extremely corrosive developing solution is able to penetrate the protective oxide and attack the metal layer at the bottom of the aperture and may even significantly erode the electrode metal layer 52 as indicated by the pitting 68a and 68b at the bottom of the aperture 56. This corrosive attack of the electrode layer sufficiently weakens the integrity of the hinge post to cause structural and/or electrical failures. Therefore, it would be advantageous to develop a fabrication process that does not result in damage to the structural integrity of the hinge post.

SUMMARY OF THE INVENTION

These and other problems are generally solved or circumvented, and technical advantages are generally achieved, by preferred embodiments of the present invention which discloses a structure and manufacturing process for forming a metal hinge post structure over an electrically conductive electrode made of a suitable material such as aluminum or titanium and the like. According to the invention, a patterned spacer layer having a top surface is formed on the electrically conductive electrode. The patterned spacer layer defines at least one hinge post aperture that extends from the top surface through the spacer layer to the electrode layer. A metal layer of the beam/hinge (binge) material and having a thickness of between about 400 Å and 900 Å is formed over the spacer layer and an oxide layer having a thickness of between about 2,000 Å and 5,000 Å is formed over the metal layer. An anti-reflective coating such as a BARC layer or a layer of other protective material, such as for example only, ARC or photoresist is deposited over the oxide layer to a thickness of about 890 Å. Since the protective layer will pool in the post aperture, the thickness of the layer in the aperture will be between about 2,000 Å and 4,000 Å.

The BARC or protective layer is then etched to remove the 890 Å covering the oxide layer. Since the etching rate is constant, a layer of the BARC or protective material between 1000 Å-3000 Å will remain at the bottom of the hinge post aperture. The exposed oxide layer is then anisotropically etched such that a cup shaped oxide layer remains in the hinge post aperture to provide support.

The structure is then cleaned with a solution of ammonia hydroxide (NH$_3$OH). However, because of the protective layer and oxide layer, the metal hinge post structure is more robust and the electrically conductive electrode is not damaged. The patterned spacer layer is then removed and thereby forms the final hinge post structure.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
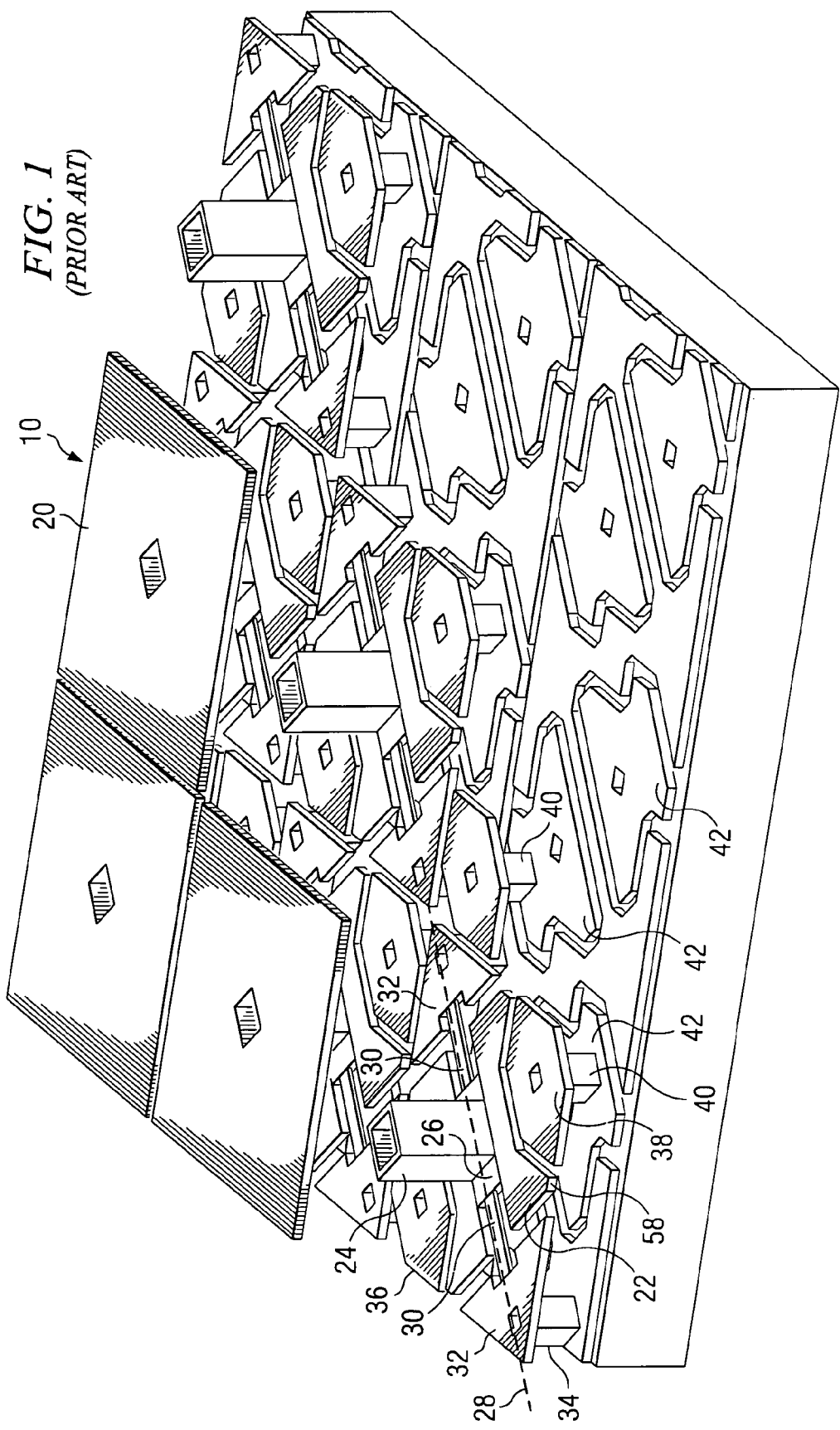
FIG. 1 is a prior art illustration showing a multiplicity of micromirror hinge post structures.
Figure 2:
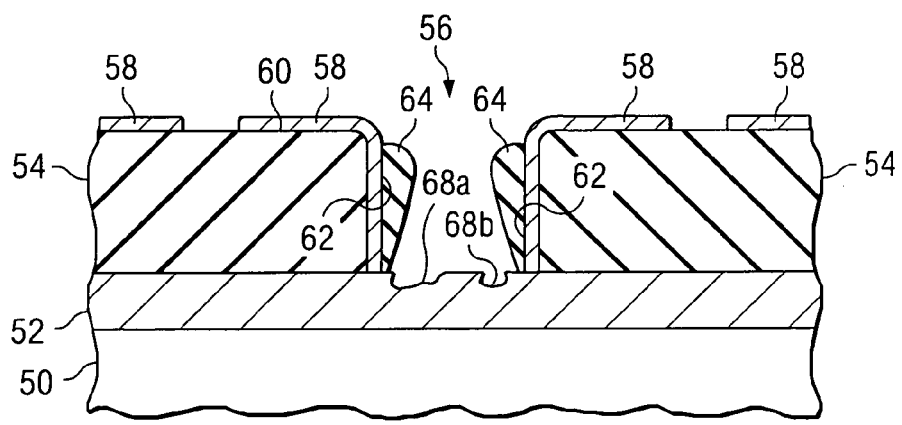
FIG. 2 is a cross-sectional view of a prior art hinge post structure.
Figure 3:
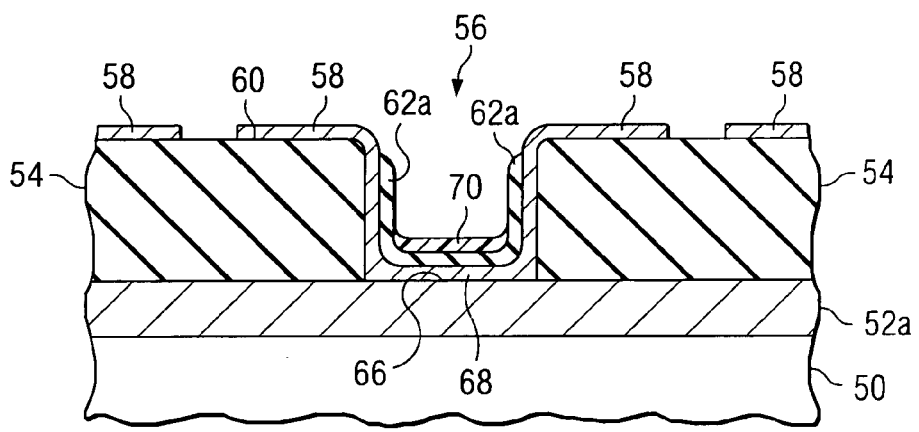
FIG. 3 is a cross-sectional view of a hinge post structure according to the teachings of the present invention.

Referring now to FIG. 3, there is illustrated a metal hinge post structure over an electrically conductive electrode 52a formed according to the teachings of the present invention. In the structure shown in FIG. 3, the spacer material 54 has not yet been removed. As shown, a metal layer 58 not only covers the sidewalls 62 of the aperture 56 and the top surface 60 of the spacer layer 54 as shown and discussed with respect to the prior art FIG. 2, but is also present on the exposed planar top surface 66 of the electrically conductive layer 52A located at the bottom of the aperture 56. The layer of metal at the bottom of the aperture 56 is identified by reference number 68 and is preferably a metal layer mode of the "Binge" material of between about 400 Å and 900 Å and comprises. The term "Binge" is an acronym that stands for beam and hinge. As shown, the metal filling the aperture 56 defines a cup shape that is substantially more robust than the metal post structure of FIG. 2. Also as shown, an oxide layer 62a having a thickness of between about 570 Å and 2,000 Å also covers the layer of metal 68 at the bottom of the aperture as well as the sidewalls so as to form a cup shaped oxide layer. The bottom portion of the cup shaped oxide layer 62a is itself covered with a protective layer 70, such as for example, a layer of photoresist, ARC, or preferably BARC (Bottom Anti Reflective Coating) having a thickness of between about 1,000 Å and 3,000 Å. As can be seen, the hinge post structure of the present invention is more robust than the prior art and also protects the electrically conductive electrode from erosion and pitting during the cleaning process.

Figure 4A:
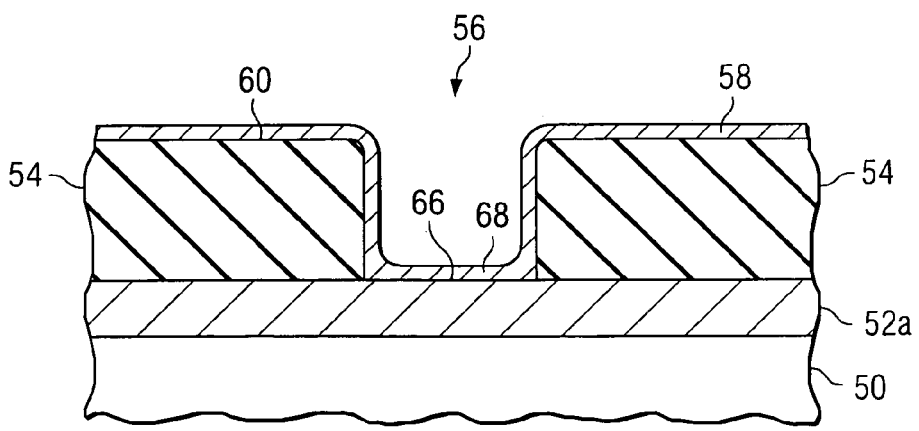
FIGS. 4A-4D illustrate the processing steps for developing the new hinge post structure of the present invention.

Referring now to FIG. 3 and FIGS. 4A through 4D, the process of this invention for forming the structure of FIG. 3 will be described. As is shown in FIG. 4A, there is a substrate 50 covered with a layer of metal 52a, such as aluminum, titanium, and various combinations of the metals including the combination of aluminum, titanium, and silicon. As discussed above, the layer of metal 52a will serve as an electronically conductive electrode. A sacrificial spacer layer 54 is patterned with a multiplicity of apertures, such as aperture 56 and is then covered with a layer of metal 58 having a thickness of between about 400 Å and 900 Å. As discussed above, the metal is preferably a "Binge" metal. It is important to note the metal layer 58 includes a planar bottom portion 68 over the exposed top surface 66 of the electrically conductive electrode 52a.

Figure 4B:
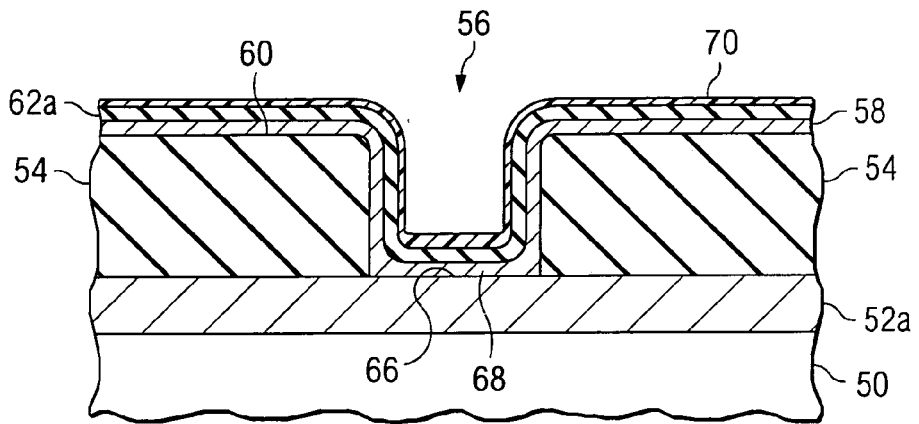

A layer of oxide 62a having a thickness of between about 2,000 Å and 5,000 Å is then deposited over metal layer 58 including the metal layer on the sidewalls and at the bottom of the apertures, as show in FIG. 4B. As also shown in FIG.

4B, a protective layer 70 of Anti-Reflective Coating or a photoresist material is then deposited over the structure by spinning on the layer 70 of the protective material to cover the oxide layer 62a. The protective layer 70 is preferably a BARC layer spun on or deposited on the top surface of the structure to a thickness of about 890 Å. As is known by those skilled in the art, the spin coat process will result in pooling of the protective material at the bottom of the aperture to a greater thickness than the thickness at the surface of the structure. For example, spinning on a 890 Å coat of BARC on the surface of the structure will result in a layer at the bottom of the aperture having a thickness of between about 2,000 Å to 4,000 Å.

Figure 4C:
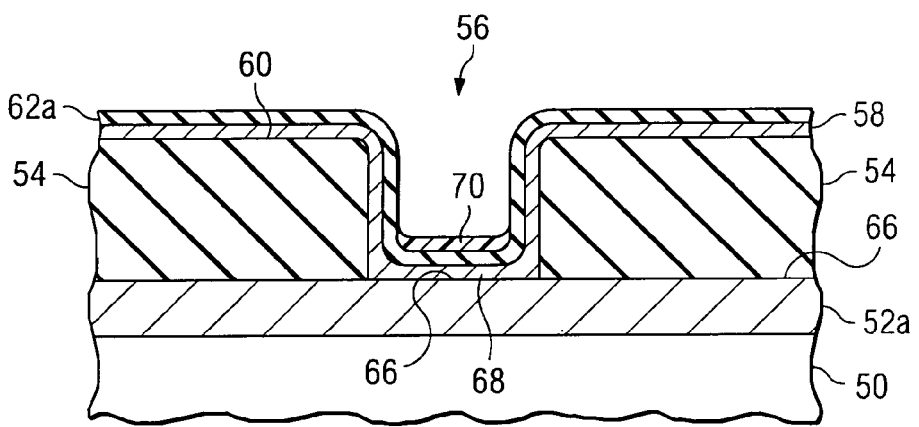

The protective BARC or photoresist layer 70 is then etched as shown in FIG. 4C, until all of the material is removed from the top surface of the structure. However, the rate of etching of the protective layer 70 is substantially consistent on the top surface of the structure and at the bottom of the aperture. Consequently, when all of the protective material has been etched away on the top surface of the structure so as to expose the oxide layer 62a there remains a layer 70 of the protective material such as BARC at the bottom of the aperture 56 having a thickness of between about 1,000 Å to 3,000 Å.

The oxide layer 62a is then anisotropically etched such as by anisotropically plasma etching until the oxide layer 62a on the top surface of the structure is removed. As will be appreciated by those skilled in the art, anisotropically etching the oxide layer 62a as shown in FIG. 4C until the oxide is completely removed from the top surface of the metal layer 58 will result in the structure of FIG. 3, described above. That is, the oxide on the sidewalls is only partially removed and the oxide at the bottom of the aperture is not etched at all, as it is protected by the protective layer.

Then, after patterning and etching the metal layer, the hinge point structure is cleaned with a solution of ammonia hydroxide ($NH_3OH$). However, unlike the prior art, the sidewalls and the bottom of the aperture are well protected by a metal layer, an oxide layer, and a layer of protective material such as BARC. Consequently, the cleaning solution cannot attack the electrode 52 and weaken the hinge post structure.

Alternately, the use of protective coating of BARC or photoresist process as described above may also be used after the oxide etch and before clean up that could damage the layer of binge material as the underlying layer.

Figure 4D:
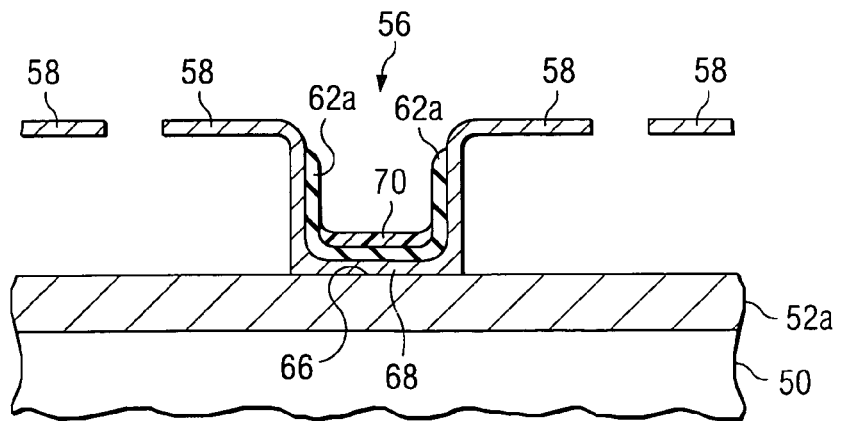

FIG. 4D shows the resulting hinge post structure after the spacer material 54 has been removed.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, manufacture, means, methods, or steps, presently existing or later to be developed, that perform substantially the same function or achieve substantially the same result as the corresponding embodiments described herein may be utilized according to the present invention. Accordingly, the appended claims are intended to include within their scope such processes, manufacture, means, methods, or steps.

What is claimed is:

1. A process for forming a metal hinge post structure over an electrically conductive electrode comprising the steps of:
    forming a patterned spacer layer having a top surface on said electrically conductive electrode, said patterned spacer layer defining at least one hinge post aperture extending from said top surface through said spacer layer to said electrically conductive electrode;
    forming a metal layer over said spacer layer;
    forming an oxide layer over said metal layer;
    depositing a protective layer over said oxide layer, said protective layer deposited to a first thickness over said top surface of said spacer layer and to a second thickness in said at least one hinge post aperture, said second thickness greater than said first thickness;
    etching said protective layer to expose said oxide layer, such that only a layer of said protective material remains at the bottom of said at least one hinge post aperture;
    anisotropically etching said oxide layer such that a cup-shaped layer of oxide remains in said at least one hinge post aperture; and
    cleaning said metal layer and said at least one hinge post aperture.

2. The process of claim 1 further comprising the step of removing said spacer layer.

3. The process of claim 1 wherein said patterned spacer layer defines a multiplicity of hinge post apertures.

4. The process of claim 1 wherein said process for forming a metal hinge post structure further comprises forming a torsional hinge connected to said metal hinge post structure.

5. The process of claim 1 wherein said step of forming an oxide layer comprises forming an oxide layer having a thickness of between about 2,000 Å and about 5,000 Å.

6. The process of claim 1 wherein said protective layer is an ARC layer or a photoresist layer.

7. The process of claim 6 wherein said step of depositing a protective layer comprises spinning on a BARC layer.

8. The process of claim 7 wherein said step of spinning on said ARC layer comprises spinning on said first thickness to about 890 Å on said top surface and such that 2000 Å-4000 Å is deposited in said at least one hinge post aperture.

9. The process of claim 8 wherein the step of etching said protective layer leaves a layer of BARC material at the bottom of said at least one said hinge post aperture having a thickness of between about 1000 Å to about 3000 Å.

10. The process of claim 1 wherein said step of anisotropically etching said oxide layer comprises the step of anisotropically plasma etching said oxide layer.

11. The process of claim 1 wherein said step of forming an oxide layer comprises the step of depositing an oxide layer comprising 66% aluminum and 33% titanium.

12. The process of claim 1 wherein said step of cleaning said at least one hinge post aperture comprising cleaning with a solution of ammonia hydroxide ($NH_3OH$).

13. The process of claim 1 wherein said conductive electrode comprises a material selected from the group consisting of aluminum, titanium, and a combination of aluminum, titanium and silicon.

14. The process of claim 1 wherein said step of forming a metal layer comprises forming a layer of "binge" metal.

15. The process of claim 9 further comprising the step of "ashing" said oxide layer on said top surface.

16. The process of claim 1 wherein said spacer layer comprises silicon.

17. The process of claim 1 wherein said metal layer has a thickness of between about 400 Å and 900 Å.

18. A process for forming a multiplicity of metal hinge post structures over an electrically conductive electrode layer for supporting a reflective pixel having surface dimensions of less than 10 μm comprising the steps of:
forming a patterned spacer layer having a top surface on said electrically conductive electrode layer, said patterned spacer layer defining a multiplicity of hinge post apertures extending from said top surface through said spacer layer to said electrically conductive electrode layer;
forming a layer of "binge" metal over said spacer layer, including said multiplicity of hinge post apertures;
forming an oxide layer of aluminum and titanium over said layer of "binge" metal, including said multiplicity of hinge post apertures;
depositing a BARC layer over said oxide layer including said multiplicity of hinge post apertures, said BARC layer deposited to a first thickness over said top surface of said spacer layer and to a second thickness in said multiplicity of hinge post apertures, said second thickness being greater than said first thickness;
etching said BARC layer to expose said oxide layer, such that only a layer of BARC material remains at the bottom of said multiplicity of hinge post apertures;
anisotropically plasma etching said oxide layer such that a cup-shaped layer of oxide remains in said multiplicity of hinge post apertures; and
cleaning said metal layer and said multiplicity of hinge post apertures.

19. A hinge post structure formed over a substrate including a conductive electrode comprising:
an electrically conductive electrode;
at least one cup-shaped metal structure formed above said electrically conductive electrode, said at least one cup-shaped metal structure defining sidewalls and a planar bottom portion next to said electrically conductive electrode;
an oxide layer formed on said planar bottom portion and said sidewalls of said at least one cup-shaped metal structure; and
a protective layer covering said oxide layer formed on said planar bottom portion, wherein said protective layer does not substantially extend up said sidewalls.

20. The hinge post structure of claim 19 wherein said cup-shaped metal structure further comprises torsional hinges extending from top portion thereof.

21. The structure of claim 19 wherein said oxide layer has a thickness of between about 2,000 Å and about 5,000 Å.

22. The structure of claim 19 wherein said protective layer is a material selected from the group consisting of ARC or photoresist.

23. The structure of claim 19 wherein said protective layer is a BARC layer having a thickness of between about 1000 Å and 3000 Å.

24. The structure of claim 19 wherein said oxide layer comprises about 66% aluminum and 33% titanium.

* * * * *